United States Patent
Hu et al.

(10) Patent No.: US 9,766,054 B2
(45) Date of Patent: Sep. 19, 2017

(54) PLANAR MOTOR ROTOR DISPLACEMENT MEASURING DEVICE AND ITS MEASURING METHOD

(71) Applicants: SHANGHAI MICRO ELECTRONICS EQUIPMENT CO., LTD., Shanghai (CN); TSINGHUA UNIVERSITY, Beijing (CN)

(72) Inventors: Jinchun Hu, Beijing (CN); Yu Zhu, Beijing (CN); Wensheng Yin, Beijing (CN); Longmin Chen, Beijing (CN); Kaiming Yang, Beijing (CN); Ming Zhang, Beijing (CN); Dengfeng Xu, Beijing (CN); Haihua Mu, Beijing (CN); Chuxiong Hu, Beijing (CN); Zhao Liu, Beijing (CN)

(73) Assignees: SHANGHAI MICRO ELECTRONICS EQUIPMENT CO., LTD., Shanghai (CN); TSINGHUA UNIVERSITY, Beijing (CN)

( * ) Notice: Subject to any disclaimer, the term of this patent is extended or adjusted under 35 U.S.C. 154(b) by 505 days.

(21) Appl. No.: 14/379,106

(22) PCT Filed: Feb. 8, 2013

(86) PCT No.: PCT/CN2013/071580
§ 371 (c)(1),
(2) Date: Sep. 16, 2014

(87) PCT Pub. No.: WO2013/120451
PCT Pub. Date: Aug. 22, 2013

(65) Prior Publication Data
US 2015/0012242 A1    Jan. 8, 2015

(30) Foreign Application Priority Data
Feb. 17, 2012 (CN) .......................... 2012 1 0038659

(51) Int. Cl.
*G01B 7/30* (2006.01)
*G01M 13/00* (2006.01)
(Continued)

(52) U.S. Cl.
CPC ............. *G01B 7/30* (2013.01); *G01D 5/2013* (2013.01); *G01M 13/00* (2013.01); *G03F 7/70758* (2013.01)

(58) Field of Classification Search
CPC . G01B 7/30; G01B 7/023; G01B 7/14; G01D 5/2013; G01M 13/00; G03F 7/70758; G05B 6/02
(Continued)

(56) References Cited

U.S. PATENT DOCUMENTS 4,463,290 A * 7/1984 Asakawa ............... H02K 29/06
                                                    318/135
5,412,265 A * 5/1995 Sickafus .................. H02K 3/26
                                                    310/179
(Continued)

FOREIGN PATENT DOCUMENTS

CM    102097982 A    6/2011
CN     1599213 A     3/2005
(Continued)

OTHER PUBLICATIONS

International Search Report for PCT/CN2013/071580 filed on Feb. 8, 2013.

*Primary Examiner* — John H Le

(57) ABSTRACT

A planar motor rotor displacement measuring device and its measuring method are provided. The motor is a moving-coil type planar motor. The device comprises probes, two sets of sine sensors, two sets of cosine sensors, a signal lead wire and a signal processing circuit. The method is arranging two sets of magnetic flux density sensors within a magnetic field (Continued)

pitch τ along two vertical movement directions in the rotor located in the sine magnetic field area. Sampled signals of the four sets of sensors are respectively processed with a frequency multiplication operation, four subdivision signals are obtained, the zero-crossing points of the four subdivision signals are detected, and then two sets of orthogonal pulse signals are generated. The pulse number of the orthogonal pulse signals is counted, and phase difference of the two sets of orthogonal pulse signals is respectively detected.

3 Claims, 4 Drawing Sheets

(51) Int. Cl.
*G01D 5/20* (2006.01)
*G03F 7/20* (2006.01)

(58) Field of Classification Search
USPC .......... 702/127, 150, 151; 310/12.05, 12.06, 310/12.25; 318/135, 652, 560; 324/207.2, 207.11, 207.12, 207.15, 324/207.24, 207.25
See application file for complete search history.

(56) References Cited

U.S. PATENT DOCUMENTS

| | | | | |
|---|---|---|---|---|
| 6,175,169 | B1 * | 1/2001 | Hollis, Jr. | H02K 41/03 310/12.05 |
| 6,437,463 | B1 * | 8/2002 | Hazelton | G03F 7/70716 310/12.06 |
| 6,646,721 | B2 * | 11/2003 | Compter | G03F 7/70716 355/53 |
| 7,205,741 | B2 * | 4/2007 | Simons | G03F 7/70725 318/560 |
| 8,008,815 | B2 * | 8/2011 | Ro | B23Q 1/62 310/12.05 |
| 8,129,984 | B2 * | 3/2012 | Hosek | G01D 7/003 324/207.15 |
| 8,362,720 | B2 * | 1/2013 | Aso | G01B 7/003 318/135 |
| 8,502,423 | B2 * | 8/2013 | Shikayama | H02K 41/03 310/12.25 |
| 8,564,283 | B2 * | 10/2013 | Mita | G01D 5/145 324/207.12 |
| 8,664,943 | B2 * | 3/2014 | Okada | G01D 5/145 324/207.11 |
| 8,803,513 | B2 * | 8/2014 | Hosek | G01B 7/003 324/207.15 |

FOREIGN PATENT DOCUMENTS

| | | |
|---|---|---|
| CN | 101510749 A | 8/2009 |
| CN | 101527484 A | 9/2009 |
| CN | 101610022 A | 12/2009 |
| CN | 101769981 A | 7/2010 |
| CN | 101828149 A | 9/2010 |
| CN | 102176649 A | 9/2011 |
| CN | 102607388 A | 7/2012 |

* cited by examiner

PLANAR MOTOR ROTOR DISPLACEMENT MEASURING DEVICE AND ITS MEASURING METHOD

TECHNICAL FIELD

The invention relates to a rotor displacement measuring device for a planar motor including the sine magnetic field model and the like, and its measuring method, particularly to a subdivision displacement measuring device and computing method with relatively a long moving range and high resolution.

BACKGROUND ART

In the two-dimensional positioning and machining devices, especially the modern semiconductor micromachining equipments, and other ultra-precision machining equipments, the high-precise movement is typically implemented by the planar motor. The planar motor has attracted much attention in both the academe and the industry because of its advantages such as its quick response, high sensitivity and simple structure. Chinese Patents No. 201110045692.8, No. 200910029368.X and No. 200910088894.3 have described several types of planar motors with different structures in detail.

Currently, the detection for the rotor position of the planar motor is usually performed by the optical measurement method such as using the grating and the laser interferometer. According to Chinese Patent No. 200880111964.6, the movement measurement for the planar motor is performed with a two-dimensional grating, in which a planar grating of a larger area is required to be installed in the planar motor so as to generate optical signals with displacement information to communicate with optical sensors, and the requirement for operating environment is higher, and the surfaces of the grating ruler must be protected and prevented from being polluted; according to Chinese Patent No. 201110040403.5, the grating sensor is adopted to detect the moving position in two directions, and in each direction, a main scale and its corresponding reading head, which must meet the measuring range requirement, are required to be installed to generate Moire fringe signals or other types of optical signals with the displacement information, and the requirement for operating environment is also high; and according to Chinese Patent No. 200910029828.9, a laser position sensor is adopted to perform measurement for movement of the planar motor through laser triangulation methods or echo analysis, but the preciseness of the measurement is strongly affected by the environment, and it is difficult to guarantee high preciseness under long moving range and the signal processing is not simple and quick at the same time.

Therefore, it is desirable to develop a newly planar motor rotor displacement measuring method, which has advantages of reducing complexity of installation of the sensor, having high preciseness under long moving range and simple and quick signal processing.

SUMMARY

The present invention aims to provide a planar motor rotor displacement measuring device and measuring method thereof, which provides highly precise displacement measurement of the motor's rotor in a long moving range in a plane in two degrees-of-freedom, and can directly output orthogonal coding signals commonly used in the industry.

In order to achieve the above object, the present invention provides the following technical solution:

A planar motor rotor displacement measuring device, where the planar motor is a moving-coil type planar motor comprising a stator and a rotor on the stator, the stator includes a magnetic steel array, and a coil array is arranged on the lower surface of the rotor; the displacement measuring device comprises a probe, two sets of sine sensors, two sets of cosine sensors, a signal lead wire and a signal processing circuit; the probe is arranged at the edge of the rotor which is located in the sine magnetic field area generated by the magnetic steel array of the stator of the moving-coil type planar motor; the two sets of sine sensors include an x-direction sine sensor set and a y-direction sine sensor set, the two sets of cosine sensors include an x-direction cosine sensor set and a y-direction cosine sensor set; the sensors are arranged in the probe in such a manner, firstly, one sensor is arranged in the probe as the reference sensor, $m_y$ sensors in total including the reference sensor are uniformly arranged within a magnetic field pitch $\tau$ along the x-direction, forming the y-direction sine sensor set; taking the reference sensor as the first sensor, $m_x$ sensors in total including the reference sensor are uniformly arranged within a magnetic field pitch $\tau$ along the y-direction, forming the x-direction sine sensor set; beginning at the distance $\tau/4$ from the reference sensor in the y-direction, $m_y$ sensors are uniformly arranged within a magnetic field pitch $\tau$ along the x-direction, forming the y-direction cosine sensor set; beginning at the distance $\tau/4$ from the reference sensor in the x-direction, $m_x$ sensors are uniformly arranged within a magnetic field pitch $\tau$ along the y-direction, forming the x-direction cosine sensor set, where $m_x=2, 3, 4, \ldots, m_y=2, 3, 4, \ldots$; the signal processing circuit is connected with the output of the probe via the signal lead wire; the signal processing circuit includes an analog signal processing unit and a digital signal processing unit; and the magnetic field pitch $\tau$ is the spatial period of the sine magnetic field of the planar motor.

A moving-coil type planar motor rotor displacement measuring method, the method includes:

1) sampled signals of the x-direction sine sensor set, sampled signals of the x-direction cosine sensor set, sampled signals of the y-direction sine sensor set and sampled signals of the y-direction cosine sensor set are processed by the analog signal processing unit of the signal processing circuit, so as to obtain the x-direction sine measurement signal $S_{X0}$, the x-direction cosine measurement signal $C_{X0}$, the y-direction sine measurement signal $S_{Y0}$ and the y-direction cosine measurement signal $C_{Y0}$ respectively;

2) the x-direction sine measurement signal $S_{X0}$ and the x-direction cosine measurement signal $C_{X0}$ are processed with $n_X$ frequency multiplication operations by the digital signal processing unit of the signal processing circuit so as to obtain the x-direction sine subdivision signal $S_{Xn_X}$ and the x-direction cosine subdivision signal $C_{X,n_X}$:

$$S_{X1} = 2*S_{X0}*C_{X0}, \quad C_{X1} = C_{X0}*C_{X0} - S_{X0}*S_{X0},$$

$$S_{X2} = 2*S_{X1}*C_{X1}, \quad C_{X2} = C_{X1}*C_{X1} - S_{X1}*S_{X1},$$

$$\ldots,$$

$$S_{Xn_X} = 2*S_{X,n_X-1}*C_{X,n_X-1},$$

$$C_{Xn_X} = C_{X,n_X-1}*C_{X,n_X-1} - S_{X,n_X-1}*S_{X,n_X-1}$$

where $S_{X1}, C_{X1}, S_{X2}, C_{X2}, \ldots, S_{X,n_X-1}$ and $C_{X,n_X-1}$ are intermediate variables, $n_x=1, 2, 3, \ldots$;

also, the y-direction sine measurement signal $S_{Y0}$ and the y-direction cosine measurement signal $C_{Y0}$ are processed with $n_Y$ frequency multiplication operations by the signal processing circuit so as to obtain the y-direction sine subdivision signal $S_{Yn_Y}$ and the y-direction cosine subdivision signal $C_{Yn_Y}$:

$$S_{Y1} = 2*S_{Y0}*C_{Y0}, \quad C_{Y1} = C_{Y0}*C_{Y0} - S_{Y0}*S_{Y0},$$
$$S_{Y2} = 2*S_{Y1}*C_{Y1}, \quad C_{Y2} = C_{Y1}*C_{Y1} - S_{Y1}*S_{Y1},$$
$$\ldots,$$
$$S_{Yn_Y} = 2*S_{Y,n_Y-1}*C_{Y,n_Y-1},$$
$$C_{Yn_Y} = C_{Y,n_Y-1}*C_{Y,n_Y-1} - S_{Y,n_Y-1}*S_{Y,n_Y-1}$$

where $S_{Y1}, C_{Y1}, S_{Y2}, C_{Y2} \ldots S_{Y,n_Y-1}$ and $C_{Y,n_Y-1}$ are intermediate variables, $n_Y=1, 2, 3, \ldots$;

3) the zero-crossing points of the x-direction sine subdivision signal $S_{Xn_X}$ and the x-direction cosine subdivision signal $C_{Xn_X}$ obtained at step 2) are detected by the digital signal processing unit of the signal processing circuit respectively, generating a set of x-direction orthogonal pulse signals, that is, the x-direction sine pulse signal $A_X$ and x-direction cosine pulse signal $B_X$; also, the zero-crossing points of the y-direction sine subdivision signal $S_{Yn_Y}$ and the y-direction cosine subdivision signal $C_{Yn_Y}$ obtained at step 2) are detected respectively, generating a set of y-direction orthogonal pulse signals, that is, the y-direction sine pulse signal $A_Y$ and y-direction cosine pulse signal $B_Y$;

4) if the x-direction sine subdivision signal $S_{Xn_X}>0$, then the output of the x-direction sine pulse signal $A_X$ is of high level; if the x-direction sine subdivision signal $S_{Xn_X}<0$, then the output of the x-direction sine pulse signal $A_X$ is of low level; and if the x-direction sine subdivision signal $S_{Xn_X}=0$, then the output of the x-direction sine pulse signal $A_X$ remains unchanged; and if the x-direction cosine subdivision signal $C_{Xn_X}>0$, then the output of the x-direction cosine pulse signal $B_X$ is of high level; if the x-direction cosine subdivision signal $C_{Xn_X}<0$, then the output of the x-direction cosine pulse signal $B_X$ is of low level; and if the x-direction cosine subdivision signal $C_{Xn_X}=0$, then the output of the x-direction cosine pulse signal $B_X$ remains unchanged;

5) if the y-direction sine subdivision signal $S_{Yn_Y}>0$, then the output of the y-direction sine pulse signal $A_Y$ is of high level; if the y-direction sine subdivision signal $S_{Yn_Y}<0$, then the output of the y-direction sine pulse signal $A_Y$ is of low level; and if the y-direction sine subdivision signal $S_{Yn_Y}=0$, then the output of the y-direction sine pulse signal $A_Y$ remains unchanged; and if the y-direction cosine subdivision signal $C_{Yn_Y}>0$, then the output of the y-direction cosine pulse signal $B_Y$ is of high level; if the y-direction cosine subdivision signal $C_{Yn_Y}<0$, then the output of the y-direction cosine pulse signal $B_Y$ is of low level; and if the y-direction cosine subdivision signal $C_{Yn_Y}=0$, then the output of the y-direction cosine pulse signal $B_Y$ remains unchanged;

6) the pulse numbers of the x-direction sine pulse signal $A_X$ or the x-direction cosine pulse signal $B_X$ obtained at step 3) are counted by the digital signal processing unit of the signal processing circuit, and the phase difference between the x-direction sine pulse signal $A_X$ and the x-direction cosine pulse signal $B_X$ is detected; taking one pulse of the x-direction sine pulse signal $A_X$ or the x-direction cosine pulse signal $B_X$ as an x-direction displacement resolution $$\frac{\tau}{2^{n_X}},$$

$n_X=1, 2, 3, \ldots$, if the phase of the x-direction sine pulse signal $A_X$ is behind the phase of the x-direction cosine pulse signal $B_X$, then it indicates that it is the forward displacement; and if the phase of the x-direction sine pulse signal $A_X$ is ahead of the phase of the x-direction cosine pulse signal $B_X$, then it indicates that it is the backward displacement, in such a way, the x-direction displacement of the rotor of the planar motor is measured;

7) the pulse numbers of the y-direction sine pulse signal $A_Y$ or the y-direction cosine pulse signal $B_Y$ obtained at step 3) are counted by the digital signal processing unit of the signal processing circuit, and the phase difference between the y-direction sine pulse signal $A_Y$ and the y-direction cosine pulse signal $B_Y$ is detected; taking one pulse of the y-direction sine pulse signal $A_Y$ or the y-direction cosine pulse signal $B_Y$ as a y-direction displacement resolution $$\frac{\tau}{2^{n_Y}}$$

$n_Y=1, 2, 3, \ldots$, if the phase of the y-direction sine pulse signal $A_Y$ is behind the phase of the y-direction cosine pulse signal $B_Y$, then it indicates that it is the forward displacement; and if the phase of the y-direction sine pulse signal $A_Y$ is ahead of the phase of the y-direction cosine pulse signal $B_Y$, then it indicates that it is the backward displacement, in such a way, the y-direction displacement of the rotor of the planar motor is measured.

The invention is characterized in that, $n_X$ can be determined as follows:

given that the $B_{XM}$ is the magnitude of the magnetic induction intensity along the x-direction of the sine magnetic field generated by the magnetic steel array of the stator of the planar motor, and $v_x$ is the noise in the sensor measurement along the x-direction, then the maximized number of times of frequency multiplication operations along the x-direction is $$n_X = \left[\log_2\left(\frac{B_{XM}}{v_x}\right) - 3\right]$$

$n_Y$ described at step 2) can be determined as follows:

given that the $B_{YM}$ is the magnitude of the magnetic induction intensity along the y-direction of the sine magnetic field generated by the magnetic steel array of the stator of the planar motor, and $v_y$ is the noise in the sensor measurement along the y-direction, then the maximized number of times of frequency multiplication operations along the y-direction is $$n_Y = \left[\log_2\left(\frac{B_{YM}}{v_y}\right) - 3\right]$$

Compared with the prior art, the invention has the following advantages: The method only involves simple subtraction and multiplication to derive the displacement information contained in the magnetic field signals and it directly utilize the sine magnetic field of the motor itself without need of solving non-linear equations, which makes the calculation simple and quick; and for the device, it doesn't need to configure the components for generating the signals containing displacement information, which can lower the production cost significantly; and when increasing the moving range, it only needs to increase the dimension of the stator and doesn't affect the resolution for the displacement, which may achieve the planar motor rotor displacement measurement of long moving range and high precision.

Figure 1:
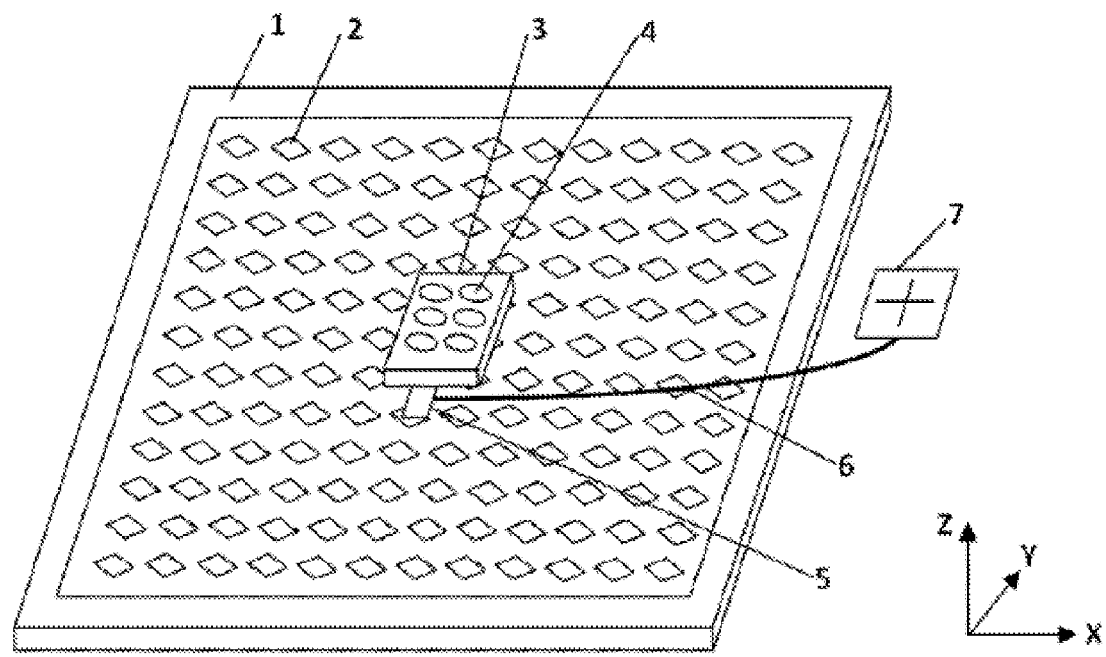
FIG. 1 is a schematic view of the overall structure of the displacement measuring device according to the present invention.

The main numerals used in the drawings are:
1 stator
2 magnetic steel array
3 rotor
4 coil array
5 probe
6 signal lead wire
7 signal processing circuit
8 x-direction sine sensor set
9 x-direction cosine sensor set
10 y-direction sine sensor set
11 y-direction cosine sensor set
12 reference sensor

MODE FOR THE INVENTION

In the following, the embodiments of the invention will be further described in detail in conjunction with the accompanying drawings.

Figure 2:
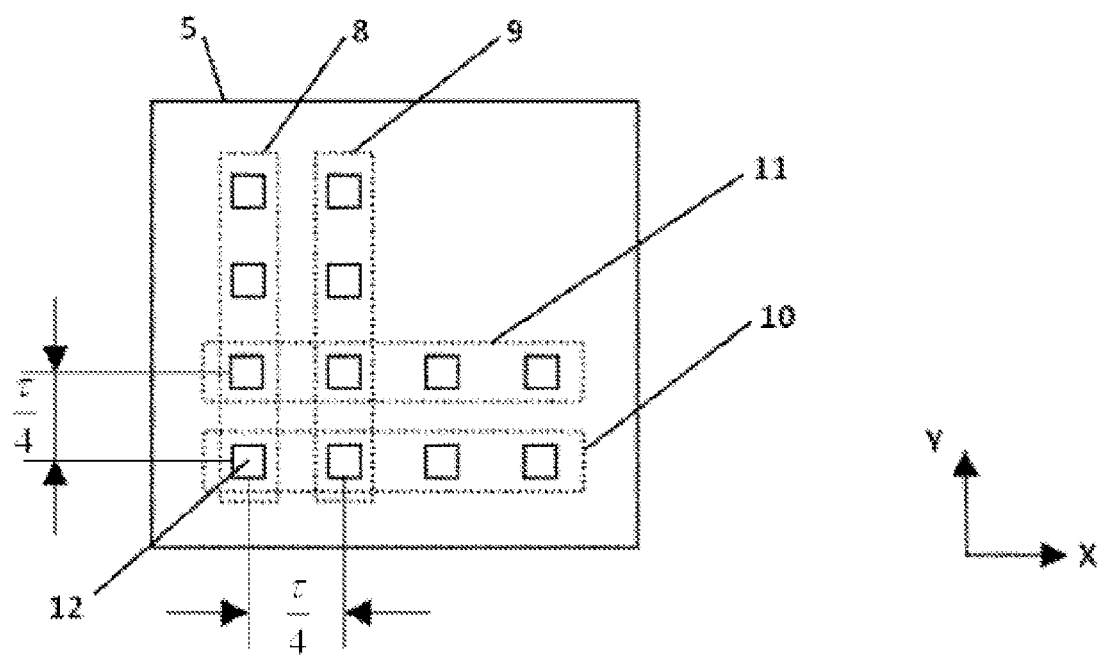
FIG. 2 is a bottom view seen from bottom to top of the probe in which $m_x=m_y=4$ according to the present invention.

Referring to FIGS. 1 and 2, the planar motor described in the invention is a moving-coil type planar motor comprising a stator 1 and a rotor 3 on the stator 1; the stator 1 includes a magnetic steel array 2, and a coil array 4 is arranged on the lower surface of the rotor 3; the displacement measuring device comprises a probe 5, two sets of sine sensors, two sets of cosine sensors, a signal lead wire 6 and a signal processing circuit 7; the probe 5 is arranged at the edge of the rotor 3 which is located in the sine magnetic field area formed by the magnetic steel array of the stator of the moving-coil type planar motor; the two sets of sine sensors include an x-direction sine sensor set 8 and a y-direction sine sensor set 10, the two sets of cosine sensors include an x-direction cosine sensor set 9 and a y-direction cosine sensor set 11; the sensors are arranged in the probe 5 in such a manner, firstly, a sensor is arranged in the probe 5 as the reference sensor 12, $m_y$ sensors in total including the reference sensor 12 are uniformly arranged within a magnetic field pitch τ along the x-direction, forming the y-direction sine sensor set; taking the reference sensor 12 as the first sensor, $m_x$ sensors in total including the reference sensor 12 are uniformly arranged within a magnetic field pitch τ along the y-direction, forming the x-direction sine sensor set; beginning at the distance τ/4 from the reference sensor 12 in the y-direction, $m_y$ sensors are uniformly arranged within a magnetic field pitch τ along the x-direction, forming the y-direction cosine sensor set; beginning at the distance τ/4 from the reference sensor 12 in the x-direction, $m_x$ sensors are uniformly arranged within a magnetic field pitch τ along the y-direction, forming the x-direction cosine sensor set, where $m_x=2, 3, 4, \ldots, m_y=2, 3, 4, \ldots$; the signal processing circuit 7 is connected with the output of the probe 5 via the signal lead wire 6; the signal processing circuit 7 includes an analog signal processing unit and a digital signal processing unit; and the magnetic field pitch τ is the spatial period of the sine magnetic field of the planar motor.

Figure 3A:
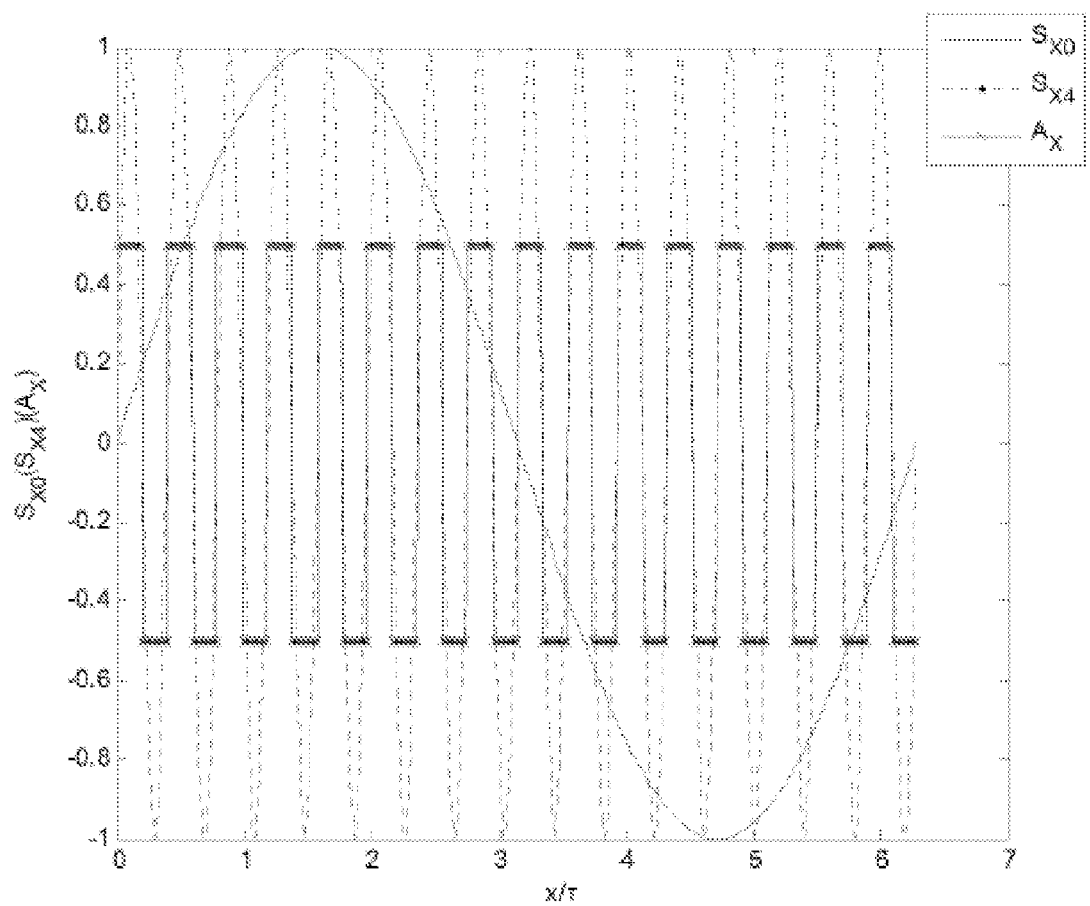
FIGS. 3a and 3b are waveform schematic views of the x-direction sine and cosine measurement signals, x-direction sine and cosine subdivision signals and x-direction sine and cosine pulse signals when $n_x=4$ according to the present invention.
Figure 3B:
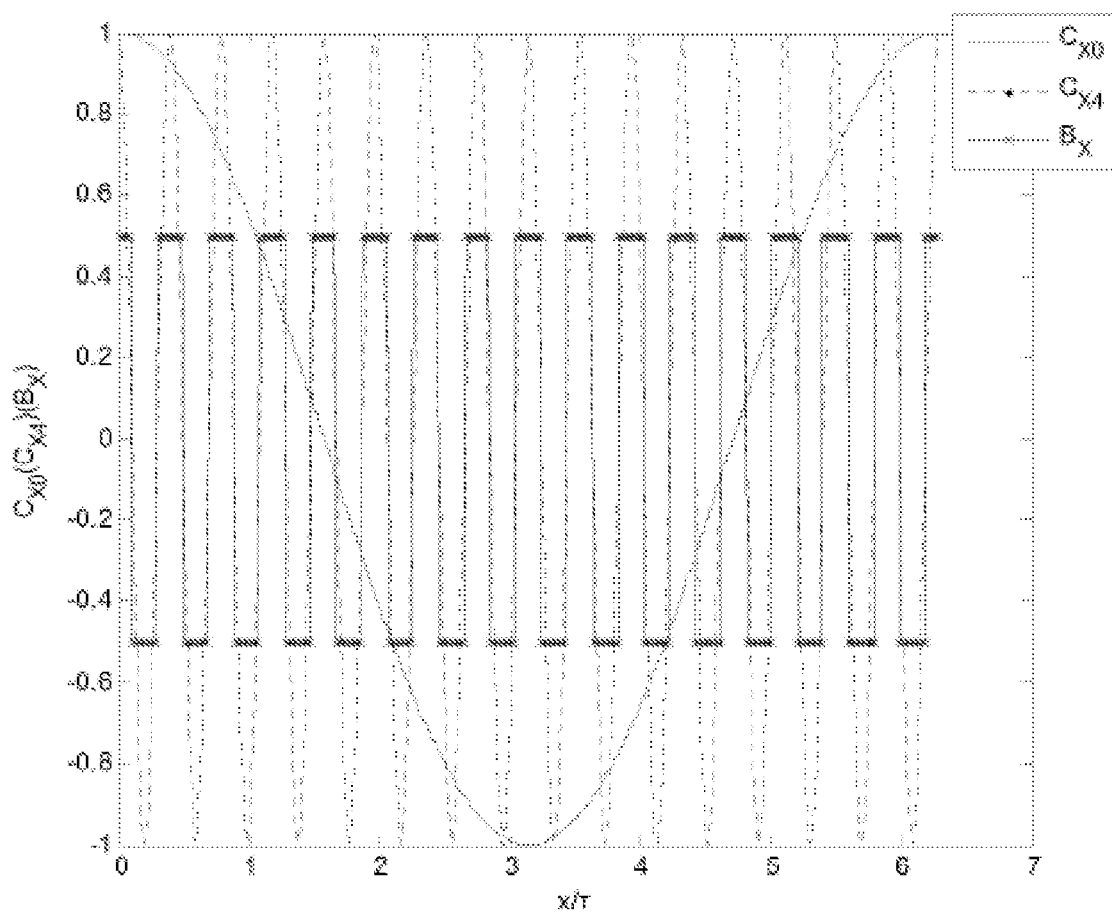

Referring to FIGS. 3a and 3b, taking the case in which the rotor 3 is in the uniform motion along the x-direction as an example, the waveforms of the x-direction sine measurement signal $S_{X0}$, the x-direction sine subdivision signal $S_{X4}$, the x-direction sine pulse signal $A_X$, and the waveforms of the x-direction cosine measurement signal $C_{X0}$, the x-direction cosine subdivision signal $C_{X4}$, and the x-direction cosine pulse signal $B_X$ during the rotor movement when $n_X=4$ are presented respectively.

Figure 4A:
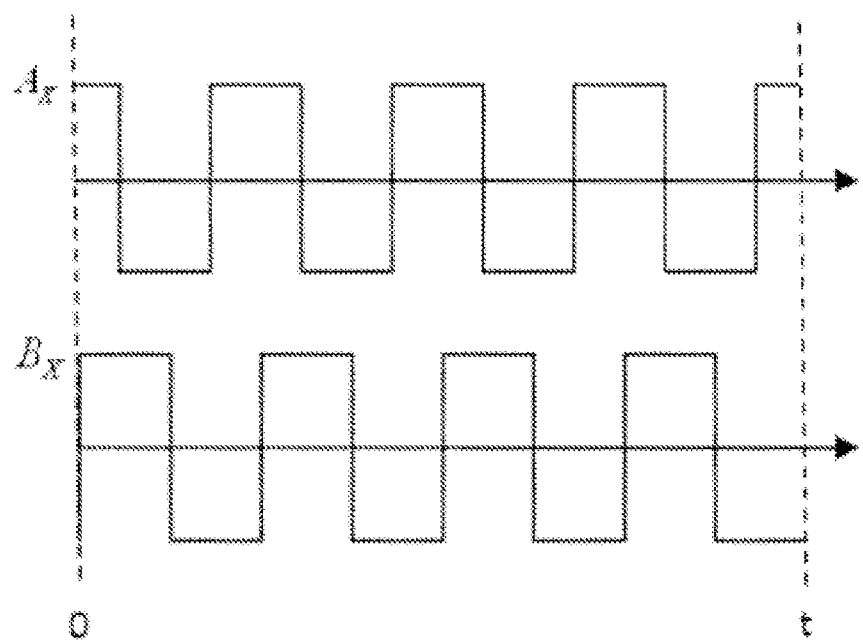
FIGS. 4a and 4b are schematic views of two sets of orthogonal pulse signals of the rotor displacement during the measurement according to the present invention.
Figure 4B:
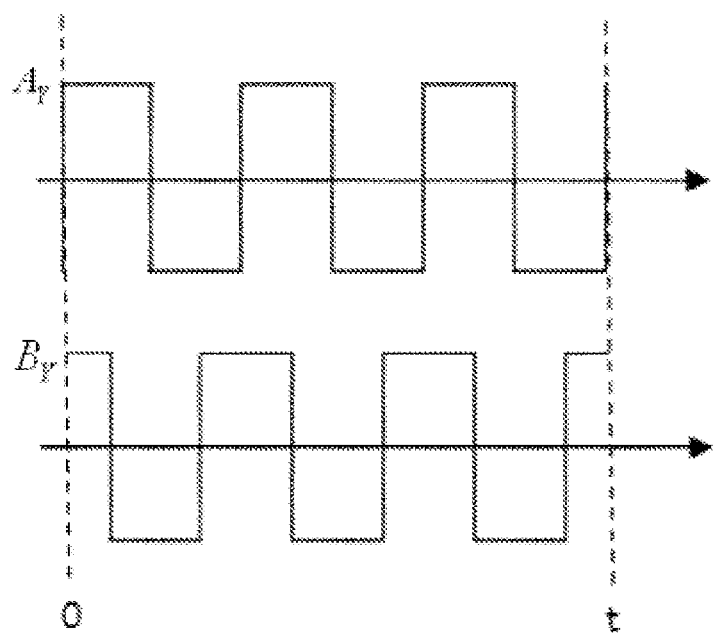

Referring to FIGS. 4a and 4b, the measurement of the x-direction displacement with the x-direction sine pulse signal $A_X$ and the x-direction cosine pulse signal $B_X$, and the measurement of the y-direction displacement with the y-direction sine pulse signal $A_Y$ and the y-direction cosine pulse signal $B_Y$ are presented respectively.

The planar motor rotor displacement measuring method described in the invention includes the following steps:

1) sampled signals of the x-direction sine sensor set, sampled signals of the x-direction cosine sensor set, sampled signals of the y-direction sine sensor set and sampled signals of the y-direction cosine sensor set are processed by the analog signal processing unit of the signal processing circuit, so as to obtain the x-direction sine measurement signal $S_{X0}$, the x-direction cosine measurement signal $C_{X0}$, the y-direction sine measurement signal $S_{Y0}$ and the y-direction cosine measurement signal $C_{Y0}$ respectively;

2) the x-direction sine measurement signal $S_{X0}$ and the x-direction cosine measurement signal $C_{X0}$ are processed with $n_X$ frequency multiplication operations by the digital signal processing unit of the signal processing circuit so as obtain the x-direction sine subdivision signal $S_{Xn_X}$ and the x-direction cosine subdivision signal $C_{Xn_X}$:

$$S_{X1} = 2*S_{X0}*C_{X0}, \quad C_{X1} = C_{X0}*C_{X0} - S_{X0}*S_{X0},$$

$$S_{X2} = 2*S_{X1}*C_{X1}, \quad C_{X2} = C_{X1}*C_{X1} - S_{X1}*S_{X1},$$

$$\ldots,$$

$$S_{Xn_X} = 2*S_{X,n_X-1}*C_{X,n_X-1},$$

$$C_{Xn_X} = C_{X,n_X-1}*C_{X,n_X-1} - S_{X,n_X-1}*S_{X,n_X-1},$$

where $S_{X1}, C_{X1}, S_{X2}, C_{X2}, \ldots, S_{X,n_X-1}$ and $C_{X,n_X-1}$ are intermediate variables, $n_X=1, 2, 3, \ldots$;

also, the y-direction sine measurement signal $S_{Y0}$ and the y-direction cosine measurement signal $C_{Y0}$ are processed with $n_Y$ frequency multiplication operations by the signal processing circuit so as to obtain the y-direction sine subdivision signal $S_{Yn_Y}$ and the y-direction cosine subdivision signal $C_{Yn_Y}$:

$$S_{Y1} = 2*S_{Y0}*C_{Y0}, \; C_{Y1} = C_{Y0}*C_{Y0} - S_{Y0}*S_{Y0},$$

$$S_{Y2} = 2*S_{Y1}*C_{Y1}, \; C_{Y2} = C_{Y1}*C_{Y1} - S_{Y1}*S_{Y1},$$

$$\ldots,$$

$$S_{Yn_Y} = 2*S_{Y,n_Y-1}*C_{Y,n_Y-1},$$

$$C_{Yn_Y} = C_{Y,n_Y-1}*C_{Y,n_Y-1} - S_{Y,n_Y-1}*S_{Y,n_Y-1},$$

where $S_{Y1}$, $C_{Y1}$, $S_{Y2}$, $C_{Y2}$, ..., $S_{Y,n_Y-1}$ and $C_{Y,n_Y-1}$ are intermediate variables, $n_X=1, 2, 3, \ldots$;

3) the zero-crossing points of the x-direction sine subdivision signal $S_{Xn_X}$ and the x-direction cosine subdivision signal $C_{Xn_X}$ obtained at step 2) are detected by the digital signal processing unit of the signal processing circuit respectively, generating a set of x-direction orthogonal pulse signals, that is, the x-direction sine pulse signal $A_X$ and x-direction cosine pulse signal $B_X$; also, the zero-crossing points of the y-direction sine subdivision signal $S_{Yn_Y}$ and the y-direction cosine subdivision signal $C_{Yn_Y}$ obtained at step 2) are detected respectively, generating a set of y-direction orthogonal pulse signals, that is, the y-direction sine pulse signal $A_Y$ and y-direction cosine pulse signal $B_Y$;

4) if the x-direction sine subdivision signal $S_{Xn_X}>0$, then the output of the x-direction sine pulse signal $A_X$ is of high level; if the x-direction sine subdivision signal $S_{Xn_X}<0$, then the output of the x-direction sine pulse signal $A_X$ is of low level; and if the x-direction sine subdivision signal $S_{Xn_X}=0$, then the output of the x-direction sine pulse signal $A_X$ remains unchanged; if the x-direction cosine subdivision signal $C_{Xn_X}>0$, then the output of the x-direction cosine pulse signal $B_X$ is of high level; if the x-direction cosine subdivision signal $C_{Xn_X}<0$, then the output of the x-direction cosine pulse signal $B_X$ is of low level; and if the x-direction cosine subdivision signal $C_{Xn_X}=0$, then the output of the x-direction cosine pulse signal $B_X$ remains unchanged;

5) if the y-direction sine subdivision signal $S_{Yn_Y}>0$, then the output of the y-direction sine pulse signal $A_Y$ is of high level; if the y-direction sine subdivision signal $S_{Yn_Y}<0$, then the output of the y-direction sine pulse signal $A_Y$ is of low level; and if the y-direction sine subdivision signal $S_{Yn_Y}=0$, then the output of the y-direction sine pulse signal $A_Y$ remains unchanged; and if the y-direction cosine subdivision signal $C_{Yn_Y}>0$, then the output of the y-direction cosine pulse signal $B_Y$ is of high level; if the y-direction cosine subdivision signal $C_{Yn_Y}<0$, then the output of the y-direction cosine pulse signal $B_Y$ is of low level; and if the y-direction cosine subdivision signal $C_{Yn_Y}=0$, then the output of the y-direction cosine pulse signal $B_Y$ remains unchanged;

6) the pulse numbers of the x-direction sine pulse signal $A_X$ or the x-direction cosine pulse signal $B_X$ obtained at step 3) are counted by the digital signal processing unit of the signal processing circuit, and the phase difference between the x-direction sine pulse signal $A_X$ and the x-direction cosine pulse signal $B_X$ is detected; taking one pulse of the x-direction sine pulse signal $A_X$ or the x-direction cosine pulse signal $B_X$ as an x-direction displacement resolution $$\frac{\tau}{2^{n_X}}$$

where $n_X=1, 2, 3, \ldots$; if the phase of the x-direction sine pulse signal $A_X$ is behind the phase of the x-direction cosine pulse signal $B_X$, then it indicates that it is the forward displacement; if the phase of the x-direction sine pulse signal $A_X$ is ahead of the phase of the x-direction cosine pulse signal $B_X$, then it indicates that it is the backward displacement, in such a way, the x-direction displacement of the rotor of the planar motor is measured;

7) the pulse numbers of the y-direction sine pulse signal $A_Y$ or the y-direction cosine pulse signal $B_Y$ obtained at step 3) are counted by the digital signal processing unit of the signal processing circuit, and the phase difference between the y-direction sine pulse signal $A_Y$ and the y-direction cosine pulse signal $B_Y$ is detected; taking one pulse of the y-direction sine pulse signal $A_Y$ or the y-direction cosine pulse signal $B_Y$ as an y-direction displacement resolution $$\frac{\tau}{2^{n_Y}}$$

$n_Y=1, 2, 3, \ldots$; if the phase of the y-direction sine pulse signal $A_Y$ is behind the phase of the y-direction cosine pulse signal $B_Y$, then it indicates that it is the forward displacement; if the phase of the y-direction sine pulse signal $A_Y$ is ahead of the phase of the y-direction cosine pulse signal $B_Y$, then it indicates that it is the backward displacement, in such a way, the y-direction displacement of the rotor of the planar motor is measured.

$n_X$ described at step 2) can be determined as follows:
given that the $B_{XM}$ is the magnitude of the magnetic induction intensity along the x-direction of the sine magnetic field generated by the magnetic steel array of the stator of the planar motor, and $v_x$ is the noise in the sensor measurement noise along the x-direction, then the maximized number of times of frequency multiplication operations along the x-direction is $$n_X = \left[\log_2\left(\frac{B_{XM}}{v_x}\right) - 3\right];$$

$n_Y$ described at step 2) can be determined as follows:
given that the $B_{YM}$ is the magnitude of the magnetic induction intensity along the y-direction of the sine magnetic field generated by the magnetic steel array of the stator of the planar motor, and $v_y$ is the noise in the sensor measurement along the y-direction, then the maximized number of times of frequency multiplication operations along the y-direction is $$n_Y = \left[\log_2\left(\frac{B_{YM}}{v_y}\right) - 3\right].$$

The embodiment:
for example, $m_x=m_y=4$, the magnetic field pitch $\tau=35.35$ mm, according to the formula of the maximized number of times of frequency multiplication operations, taking $n_X=n_Y=4$, the device and method of the invention are implemented.

The device can be seen from FIG. 1, the planar motor described in the invention is a moving-coil type planar motor comprising a stator 1 and a rotor 3 on the stator 1, the stator 1 includes a magnetic steel array 2, and a coil array 4 is arranged on the lower surface of the rotor 3; the displacement measuring device comprises a probe 5, two sets of sine sensors, two sets of cosine sensors, a signal lead wire 6 and a signal processing circuit 7; the probe 5 is arranged at the edge of the rotor 3 which is located in the sine magnetic field area generated by the magnetic steel array of the stator of the moving-coil type planar motor; the two sets of sine sensors include an x-direction sine sensor set 8 and a y-direction sine sensor set 10, the two sets of cosine sensors include an x-direction cosine sensor set 9 and a y-direction cosine sensor set 11; a probe 5 is arranged at the edge of the rotor which is located in the sine magnetic field area generated by the magnetic steel array of the stator of the moving-coil type planar motor; referring to FIG. 2, the sensors are arranged in the probe 5 in such a manner, firstly, one sensor is arranged in the probe 5 as the reference sensor 12, and then one sensor is arranged every τ/4 along a pitch τ within the magnetic field, i.e., the x-direction, 4 sensors in total including the reference sensor are arranged, forming the y-direction sine sensor set; taking the reference sensor as the first sensor, one sensor is arranged every τ/4 along another pitch τ within the magnetic field, i.e., the y-direction, 4 sensors in total including the reference sensor are arranged, forming the x-direction sine sensor set; beginning at the distance τ/4 from the reference sensor 12 in the y-direction, one sensor is arranged every τ/4 along the x-direction, 4 sensors in total, forming the y-direction cosine sensor set; beginning at the distance τ/4 from the reference sensor 12 in the x-direction, one sensor is arranged every τ/4 along the y-direction, 4 sensors in total, forming the x-direction cosine sensor set, where τ/4 is 8.8375 mm.

The method includes:

1) sampled signals of the x-direction sine sensor set, sampled signals of the x-direction cosine sensor set, sampled signals of the y-direction sine sensor set and sampled signals of the y-direction cosine sensor set are processed by the analog signal processing unit of the signal processing circuit, so as to obtain the x-direction sine measurement signal $S_{X0}$, the x-direction cosine measurement signal $C_{X0}$, the y-direction sine measurement signal $S_{Y0}$ and the y-direction cosine measurement signal $C_{Y0}$ respectively;

2) the x-direction sine measurement signal $S_{X0}$ and the x-direction cosine measurement signal $C_{X0}$ are processed with $n_X=4$ frequency multiplication operations, i.e. $2^4$ subdivision operations by the digital signal processing unit of the signal processing circuit:

$$S_{X1}=2*S_{X0}*C_{X0}, C_{X1}=C_{X0}*-C_{X0}-S_{X0}*S_{X0},$$

$$S_{X2}=2*S_{X1}*C_{X1}, C_{X2}=C_{X1}*-C_{X1}-S_{X1}*S_{X1},$$

$$S_{X3}=2*S_{X2}*C_{X2}, C_{X3}=C_{X2}*-C_{X2}-S_{X2}*S_{X2},$$

$$S_{X4}=2*S_{X3}*C_{X3}, C_{X4}=C_{X3}*-C_{X3}-S_{X3}*S_{X3},$$

so as to obtain the x-direction sine subdivision signal $S_{X4}$ and the x-direction cosine subdivision signal $C_{X4}$, where $S_{X1}$, $C_{X1}$, $S_{X2}$, $C_{X2}$, $S_{X3}$ and $C_{X3}$ are intermediate variables; also, the y-direction sine measurement signal $S_{Y0}$ and the y-direction cosine measurement signal $C_{Y0}$ are processed with $n_Y=4$ frequency multiplication operations, i.e. $2^4$ subdivision operations by the signal processing circuit:

$$S_{Y1}=2*S_{Y0}*C_{Y0}, C_{Y1}=C_{Y0}*C_{Y0}-S_{Y0}*S_{Y0},$$

$$S_{Y2}=2*S_{Y1}*C_{Y1}, C_{Y2}=C_{Y1}*C_{Y1}-S_{Y1}*S_{Y1},$$

$$S_{Y3}=2*S_{Y2}*C_{Y2}, C_{Y3}=C_{Y2}*C_{Y2}-S_{Y2}*S_{Y2},$$

$$S_{Y4}=2*S_{Y3}*C_{Y3}, C_{Y4}=C_{Y3}*C_{Y3}-S_{Y3}*S_{Y3},$$

so as to obtain the y-direction sine subdivision signal $S_{Y4}$ and the y-direction cosine subdivision signal $C_{Y4}$, where $S_{Y1}$, $C_{Y1}$, $S_{Y2}$, $C_{Y2}$, $S_{Y3}$ and $C_{Y3}$ are intermediate variables;

3) The zero-crossing points of the x-direction sine subdivision signal $S_{X8}$ and the x-direction cosine subdivision signal $C_{X8}$ are detected by the digital signal processing unit of the signal processing circuit respectively, generating a set of x-direction orthogonal pulse signals, that is, the x-direction sine pulse signal $A_X$ and x-direction cosine pulse signal $B_X$; also, the zero-crossing points of the y-direction sine subdivision signal $S_{Y8}$ and the y-direction cosine subdivision signal $C_{Y8}$ are detected respectively, generating a set of y-direction orthogonal pulse signals, that is, the y-direction sine pulse signal $A_Y$ and y-direction cosine pulse signal $B_Y$;

4) referring to FIGS. 3a and 3b, if the x-direction sine subdivision signal $S_{X8}>0$, then the output of the x-direction sine pulse signal $A_X$ is of high level; if the x-direction sine subdivision signal $S_{X8}<0$, then the output of the x-direction sine pulse signal $A_X$ is of low level; if the x-direction sine subdivision signal $S_{X8}=0$, then the output of the x-direction sine pulse signal $A_X$ remains unchanged; and if the x-direction cosine subdivision signal $C_{X8}>0$, then the output of the x-direction cosine pulse signal $B_X$ is of high level; if the x-direction cosine subdivision signal $C_{X8}<0$, then the output of the x-direction cosine pulse signal $B_X$ is of low level; if the x-direction cosine subdivision signal $C_{X8}=0$, then the output of the x-direction cosine pulse signal $B_X$ remains unchanged;

5) if the y-direction sine subdivision signal $S_{Y8}>0$, then the output of the y-direction sine pulse signal $A_Y$ is of high level; if the y-direction sine subdivision signal $S_{Y8}<0$, then the output of the y-direction sine pulse signal $A_Y$ is of low level; if the y-direction sine subdivision signal $S_{Y8}=0$, then the output of the y-direction sine pulse signal $A_Y$ remains unchanged; and if the y-direction cosine subdivision signal $C_{Y8}>0$, then the output of the y-direction cosine pulse signal $B_Y$ is of high level; if the y-direction cosine subdivision signal $C_{Y8}<0$, then the output of the y-direction cosine pulse signal $B_Y$ is of low level; if the y-direction cosine subdivision signal $C_{Y8}=0$, then the output of the y-direction cosine pulse signal $B_Y$ remains unchanged;

6) referring to FIG. 4a, the pulse number of the x-direction cosine pulse signal $B_X$ is counted by the digital signal processing unit of the signal processing circuit, and the pulse number at time t is 4 with respect to time 0, indicating the displacement is $$4*\frac{\tau}{2^n}=4*\frac{35.35\text{ mm}}{2^8}=0.5523\text{ mm long},$$

and the phase of the x-direction sine pulse signal $A_X$ is ahead of the phase of the x-direction cosine pulse signal $B_X$, indicating the backward displacement, so in FIG. 4a, the displacement in the x-direction at time t with respect to time 0 is −0.5523 mm;

referring to FIG. 4b, the pulse number of the y-direction sine pulse signal $A_Y$ is counted by the digital signal processing unit of the signal processing circuit, and the pulse number at time t is 3 with respect to time 0, indicating the displacement is $$3*\frac{\tau}{2^n}=3*\frac{35.35\text{ mm}}{2^8}=0.4143\text{ mm long},$$

and the phase of the y-direction sine pulse signal $A_Y$ is behind the phase of the y-direction cosine pulse signal $B_Y$, indicating the forward displacement, so in FIG. 4b, the displacement in the y-direction at time t with respect to time 0 is +0.4143 mm;

Through the above steps, on condition that the zero-crossing points are able to be detected, it only requires simple subtraction and multiplication to extract the displacement information contained in the magnetic field signals, and differently from the prior art, the components configured for generating signals containing the displacement information are not required, simplifying the installation of hardware and reducing the cost, and at the same time, the displacement measurement of the rotor of the planar motor of long moving range and high preciseness is still guaranteed.

Only some preferred embodiments of the present invention are described in the above. Without departing from the scope of the invention disclosed in the claims, various modification, addition and substitution should be considered as in the scope of protection of the invention.

The invention claimed is:

1. A planar motor rotor displacement measuring device, wherein the planar motor is a moving-coil type planar motor comprising a stator (1) and a rotor (3) on the stator (1), the stator (1) includes a magnetic steel array (2), and a coil array (4) is arranged on the lower surface of the rotor (3), characterized in that:

the displacement measuring device comprises a probe (5), two sets of sine sensors, two sets of cosine sensors, a signal lead wire (6) and a signal processing circuit (7);

the probe (5) is arranged at the edge of the rotor (3) which is located in a sine magnetic field area generated by the magnetic steel array of the stator of the moving-coil type planar motor;

the two sets of sine sensors include an x-direction sine sensor set (8) and a y-direction sine sensor set (10), the two sets of cosine sensors include an x-direction cosine sensor set (9) and a y-direction cosine sensor set (11);

a plurality of sensors are arranged in the probe (5) including a reference sensor (12), wherein $m_y$ sensors in total including the reference sensor (12) are uniformly arranged within one magnetic field pitch τ along an x-direction, forming the y-direction sine sensor set and $m_x$ sensors in total including the reference sensor (12) are uniformly arranged within one magnetic field pitch τ along a y-direction, forming the x-direction sine sensor set;

wherein, beginning at a distance of τ/4 from the reference sensor (12) in the y-direction, $m_y$ sensors are uniformly arranged within one magnetic field pitch τ along the x-direction, forming the y-direction cosine sensor set;

wherein, beginning at the distance of τ/4 from the reference sensor (12) in the x-direction, $m_x$ sensors are uniformly arranged within one magnetic field pitch τ along the y-direction, forming the x-direction cosine sensor set, where $m_x$=2, 3, 4, . . . , $m_y$=2, 3, 4, . . . ;

wherein the signal processing circuit (7) is connected with an output of the probe (5) via the signal lead wire (6);

wherein the signal processing circuit (7) includes an analog signal processing unit and a digital signal processing unit; and wherein the magnetic field pitch τ is a spatial period of the sine magnetic field of the planar motor.

2. A planar motor rotor displacement measuring method using the device of claim 1, characterized in that, the method includes:

1) processing, by the analog signal processing unit of the signal processing circuit, sampled signals of the x-direction sine sensor set, sampled signals of the x-direction cosine sensor set, sampled signals of the y-direction sine sensor set and sampled signals of the y-direction cosine sensor set, so as to obtain an x-direction sine measurement signal $S_{X0}$, an x-direction cosine measurement signal $C_{X0}$, a y-direction sine measurement signal $S_{Y0}$ and a y-direction cosine measurement signal $C_{Y0}$, respectively;

2) processing the x-direction sine measurement signal $S_{X0}$ and the x-direction cosine measurement signal $C_{X0}$ with the following $n_X$ frequency multiplication operations by the digital signal processing unit of the signal processing circuit, so as to obtain an x-direction sine subdivision signal $S_{Xn_X}$ and an x-direction cosine subdivision signal $C_{Xn_X}$:

$$S_{X1} = 2*S_{X0}*C_{X0}, C_{X1} = C_{X0}*C_{X0} - S_{X0}*S_{X0},$$
$$S_{X2} = 2*S_{X1}*C_{X1}, C_{X2} = C_{X1}*C_{X1} - S_{X1}*S_{X1},$$
$$\ldots,$$
$$S_{Xn_X} = 2*S_{X,n_X-1}*C_{X,n_X-1},$$
$$C_{Xn_X} = C_{X,n_X-1}*C_{X,n_X-1} - S_{X,n_X-1}*S_{X,n_X-1}$$

where $S_{X1}$, $C_{X1}$, $S_{X2}$, $C_{X2}$, . . . , $S_{X,n_X-1}$ and $C_{X,n_X-1}$ are intermediate variables, $n_X$=1, 2, 3, . . . ;

while, the y-direction sine measurement signal $S_{Y0}$ and the y-direction cosine measurement signal $C_{Y0}$ are processed with the following $n_Y$ frequency multiplication operations by the signal processing circuit, so as to obtain a y-direction sine subdivision signal $S_{Yn_Y}$ and a y-direction cosine subdivision signal $C_{Yn_Y}$:

$$S_{Y1} = 2*S_{Y0}*C_{Y0}, C_{Y1} = C_{Y0}*C_{Y0} - S_{Y0}*S_{Y0},$$
$$S_{Y2} = 2*S_{Y1}*C_{Y1}, C_{Y2} = C_{Y1}*C_{Y1} - S_{Y1}*S_{Y1},$$
$$\ldots,$$
$$S_{Yn_Y} = 2*S_{Y,n_Y-1}*C_{Y,n_Y-1},$$
$$C_{Yn_Y} = C_{Y,n_Y-1}*C_{Y,n_Y-1} - S_{Y,n_Y-1}*S_{Y,n_Y-1}$$

where $S_{Y1}$, $C_{Y1}$, $S_{Y2}$, $C_{Y2}$, . . . , $S_{Y,n_Y-1}$ and $C_{Y,n_Y-1}$ are intermediate variables, $n_Y$=1, 2, 3, . . . ;

3) detecting zero-crossing points of the x-direction sine subdivision signal $S_{Xn_X}$ and the x-direction cosine subdivision signal $C_{Xn_X}$ obtained at step 2) by the digital signal processing unit of the signal processing circuit respectively, generating a set of x-direction orthogonal pulse signals, that is, an x-direction sine pulse signal $A_X$ and an x-direction cosine pulse signal $B_X$; while, the zero-crossing points of the y-direction sine subdivision signal $S_{Yn_Y}$ and the y-direction cosine subdivision signal $C_{Yn_Y}$ obtained at step 2) are detected respectively, generating a set of y-direction orthogonal pulse signals, that is, a y-direction sine pulse signal $A_Y$ and a y-direction cosine pulse signal $B_Y$;

4) if the x-direction sine subdivision signal $S_{Xn_X}>0$, then the output of the x-direction sine pulse signal $A_X$ is of high level; if the x-direction sine subdivision signal $S_{Xn_X}<0$, then the output of the x-direction sine pulse signal $A_X$ is of low level; and if the x-direction sine subdivision signal $S_{Xn_X}=0$, then the output of the x-direction sine pulse signal $A_X$ remains unchanged; if the x-direction cosine subdivision signal $C_{Xn_X}>0$, then the output of the x-direction cosine pulse signal $B_X$ is of high level; if the x-direction cosine subdivision signal $C_{Xn_X}<0$, then the output of the x-direction cosine pulse signal $B_X$ is of low level; and if the x-direction cosine subdivision signal $C_{Xn_X}=0$, then the output of the x-direction cosine pulse signal $B_X$ remains unchanged;

5) if the y-direction sine subdivision signal $S_{Yn_Y}>0$, then the output of the y-direction sine pulse signal $A_Y$ is of high level; if the y-direction sine subdivision signal $S_{Yn_Y}<0$, then the output of the y-direction sine pulse signal $A_Y$ is of low level; and if the y-direction sine subdivision signal $S_{Yn_Y}=0$, then the output of the y-direction sine pulse signal $A_Y$ remains unchanged; if the y-direction cosine subdivision signal $C_{Yn_Y}>0$, then the output of the y-direction cosine pulse signal $B_Y$ is of high level; if the y-direction cosine subdivision signal $C_{Yn_Y}<0$, then the output of the y-direction cosine pulse signal $B_Y$ is of low level; and if the y-direction cosine subdivision signal $C_{Yn_Y}=0$, then the output of the y-direction cosine pulse signal $B_Y$ remains unchanged;

6) counting the pulse numbers of the x-direction sine pulse signal $A_X$ or the x-direction cosine pulse signal $B_X$ obtained at step 3) by the digital signal processing unit of the signal processing circuit, and detecting a phase difference between the x-direction sine pulse signal $A_X$ and the x-direction cosine pulse signal $B_X$; taking one pulse of the x-direction sine pulse signal $A_X$ or the x-direction cosine pulse signal $B_X$ as an x-direction displacement resolution $$\frac{\tau}{2^{n_X}}$$

$n_X=1, 2, 3, \ldots$, if the phase of the x-direction sine pulse signal $A_X$ is behind the phase of the x-direction cosine pulse signal $B_X$, then it indicates that it is the forward displacement; and if the phase of the x-direction sine pulse signal $A_X$ is ahead of the phase of the x-direction cosine pulse signal $B_X$, then it indicates that it is the backward displacement, in such a way, the x-direction displacement of the rotor of the planar motor is measured;

7) counting the pulse numbers of the y-direction sine pulse signal $A_Y$ or the y-direction cosine pulse signal $B_Y$ obtained at step 3) by the digital signal processing unit of the signal processing circuit, and detecting the phase difference between the y-direction sine pulse signal $A_Y$ and the y-direction cosine pulse signal $B_Y$; taking one pulse of the y-direction sine pulse signal $A_Y$ or the y-direction cosine pulse signal $B_Y$ as a y-direction displacement resolution $$\frac{\tau}{2^{n_Y}}$$

$n_Y=1, 2, 3, \ldots$, and if the phase of the y-direction sine pulse signal $A_Y$ is behind the phase of the y-direction cosine pulse signal $B_Y$, then it indicates that it is the forward displacement; and if the phase of the y-direction sine pulse signal $A_Y$ is ahead of the phase of the y-direction cosine pulse signal $B_Y$, then it indicates that it is the backward displacement, in such a way, the y-direction displacement of the rotor of the planar motor is measured.

3. The planar motor rotor displacement measuring method of claim 2, characterized in that, $n_X$ described at step 2) is determined as follows:

given that the $B_{XM}$ is the magnitude of the magnetic induction intensity in the x-direction of the sine magnetic field generated by the magnetic steel array of the stator of the planar motor, and $v_x$ is the noise in the sensor measurement in the x-direction, then the maximized number of times of the frequency multiplication operations in the x-direction is $$n_X = \left[\log_2\left(\frac{B_{XM}}{v_x}\right) - 3\right]$$

$n_Y$ described at step 2) is determined as follows:

given that the $B_{YM}$ is the magnitude of the magnetic induction intensity in the y-direction of the sine magnetic field generated by the magnetic steel array of the stator of the planar motor, and $v_y$ is the noise in the sensor measurement in the y-direction, then the maximized number of times of frequency multiplication operations in the y-direction is $$n_Y = \left[\log_2\left(\frac{B_{XM}}{v_y}\right) - 3\right].$$

* * * * *